United States Patent [19]
Bach

[11] Patent Number: 6,114,903
[45] Date of Patent: *Sep. 5, 2000

[54] LAYOUT ARCHITECTURE FOR CORE I/O BUFFER

[75] Inventor: Randall Bach, Stillwater, Minn.

[73] Assignee: LSI Logic Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/007,258

[22] Filed: Jan. 14, 1998

[51] Int. Cl.[7] ................................................. H01L 25/00
[52] U.S. Cl. .......................... 327/565; 364/491; 257/357
[58] Field of Search ............................ 327/565; 364/488, 364/489, 490, 491; 257/206, 357

[56] References Cited

U.S. PATENT DOCUMENTS

| | | | |
|---|---|---|---|
| 4,278,897 | 7/1981 | Ohno et al. | 326/101 |
| 4,488,267 | 12/1984 | Harrison | 365/201 |
| 5,307,286 | 4/1994 | Rusu et al. | 364/490 |
| 5,452,251 | 9/1995 | Akaogi et al. | 365/200 |
| 5,663,677 | 9/1997 | Freyman et al. | 327/565 |
| 5,694,078 | 12/1997 | Nomura et al. | 327/565 |
| 5,744,839 | 4/1998 | Ma et al. | 257/356 |

*Primary Examiner*—Timothy P. Callahan
*Assistant Examiner*—Hai L. Nguyen

[57] ABSTRACT

An integrated circuit residing within a die includes at least two columns of circuits separated by a routing space. A buffer is formed within the integrated circuit for transferring signals between the integrated circuit and a location remote from the die. At least one portion of the buffer is formed as a buffer circuit column, where the buffer circuit column is aligned with a column of circuits within the integrated circuit but outside of the buffer.

25 Claims, 6 Drawing Sheets

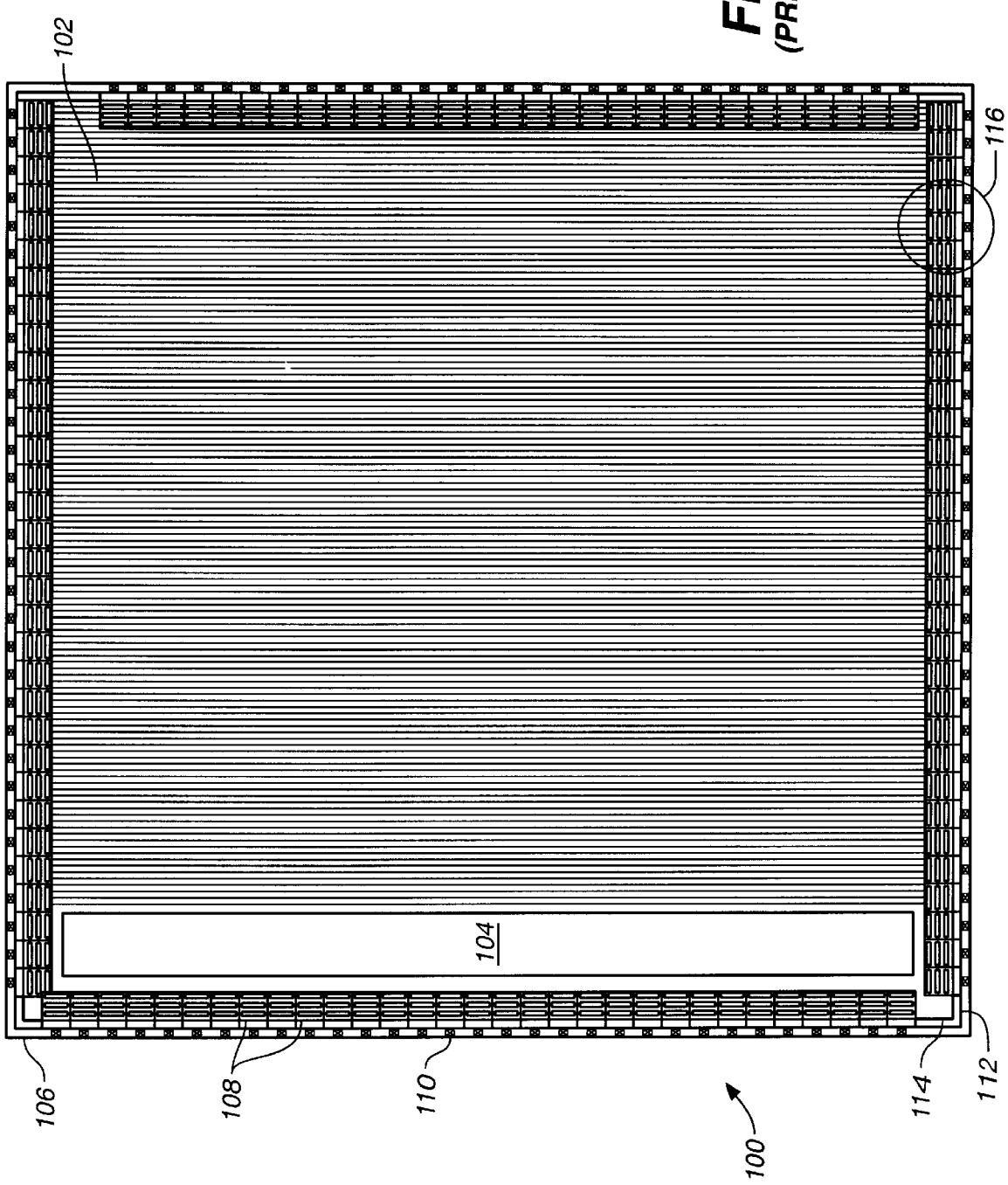
FIG._1 (PRIOR ART)

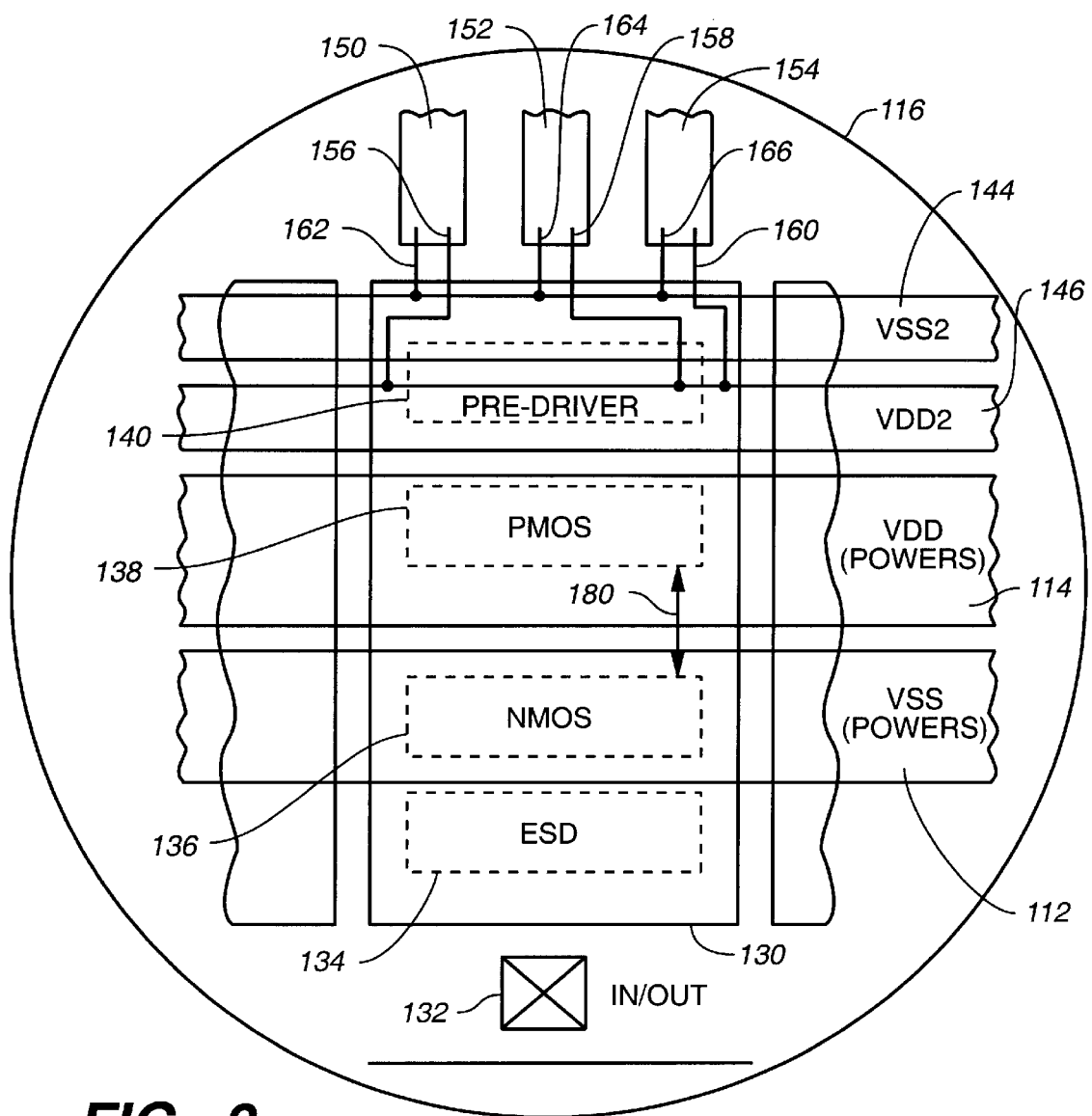
FIG._2
*(PRIOR ART)*

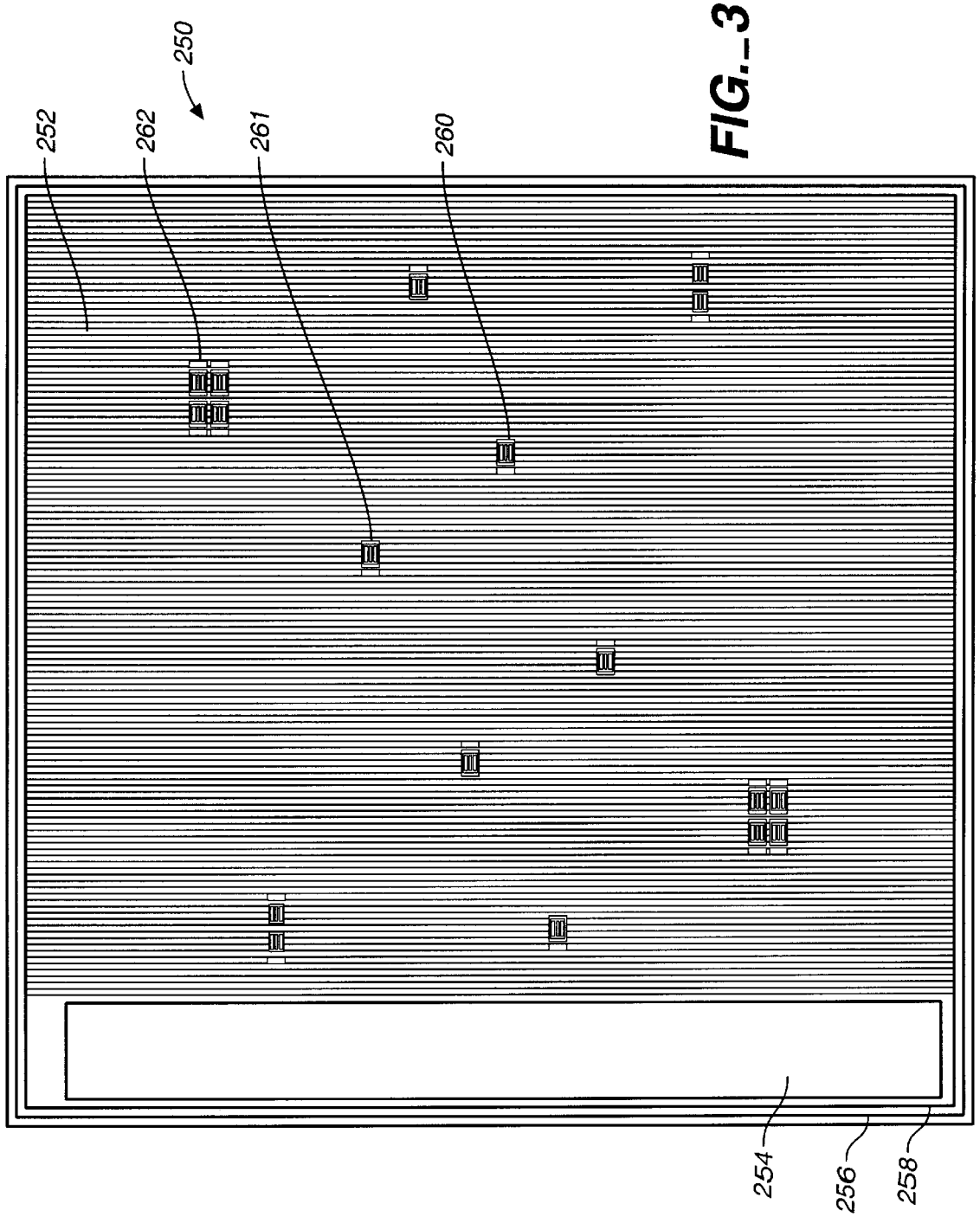
FIG._3

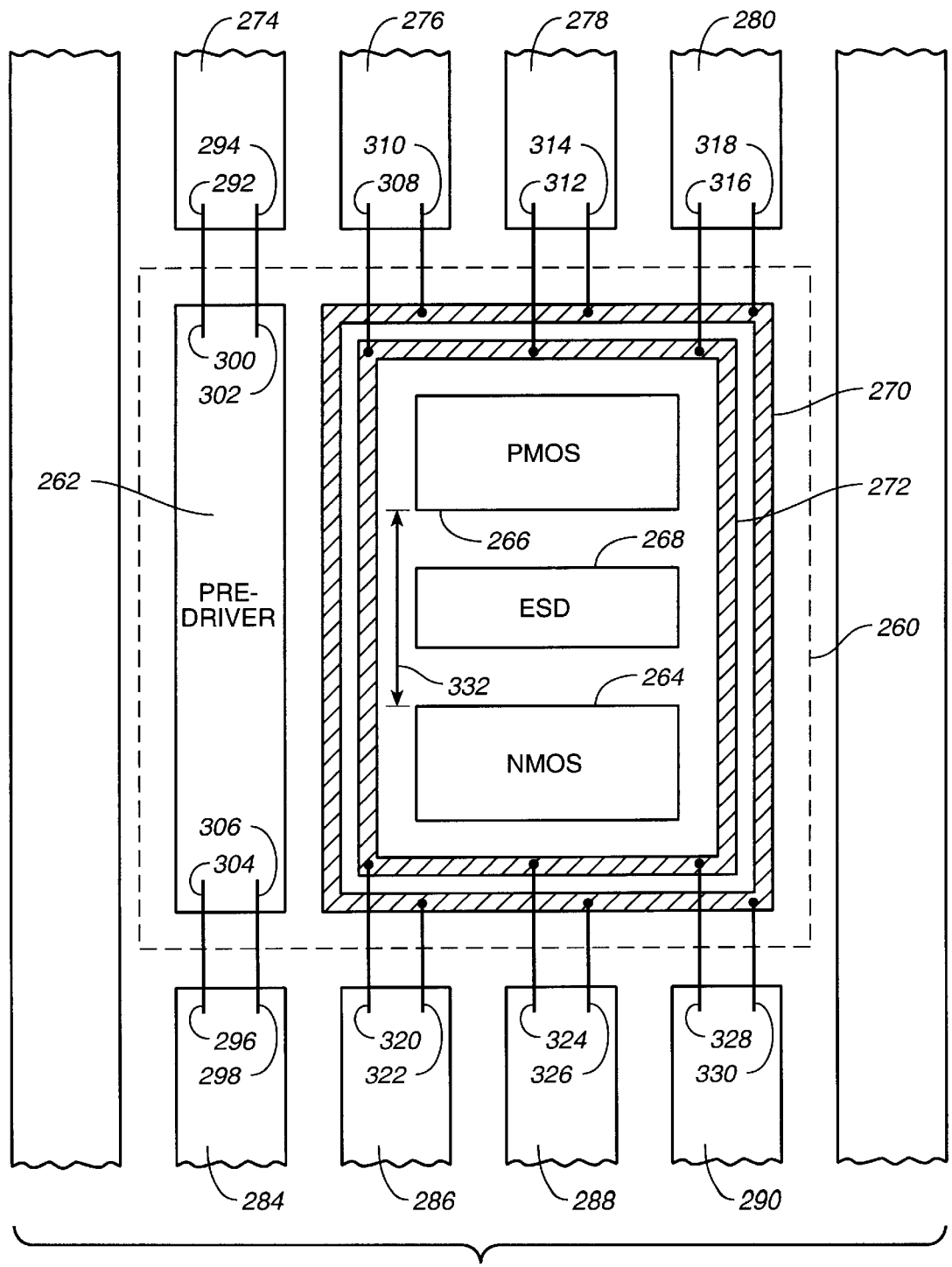
FIG._4

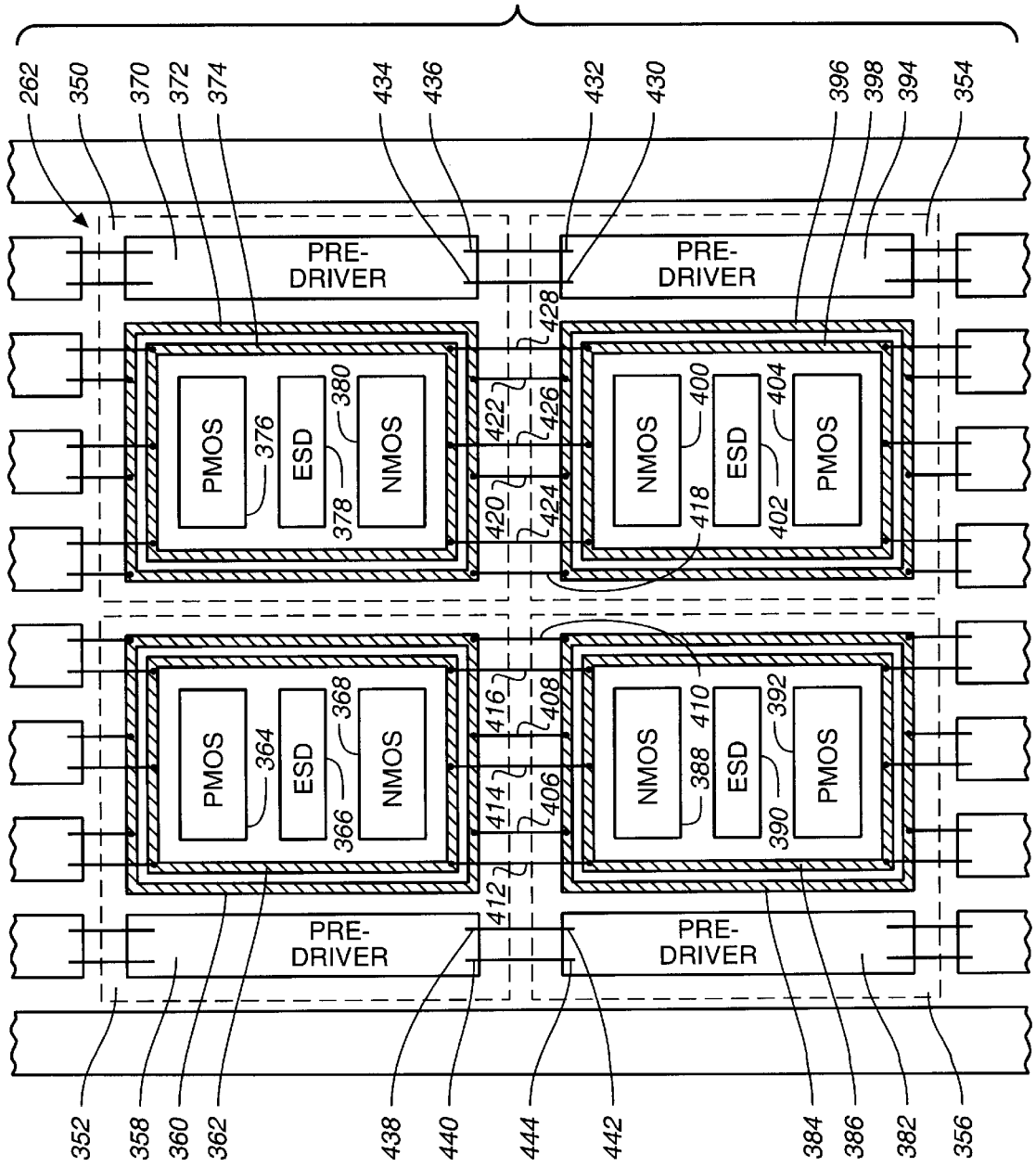

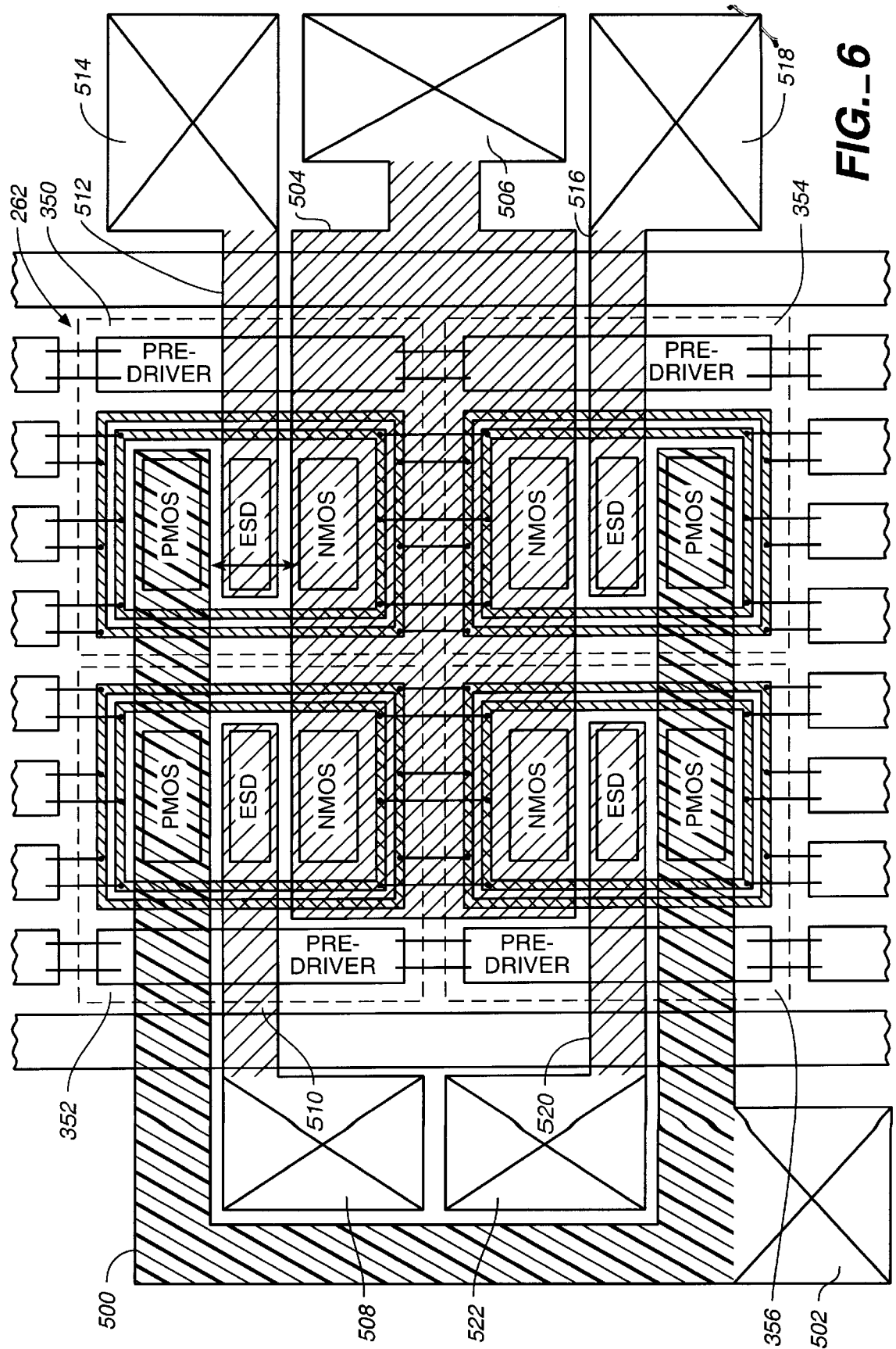
FIG._6

LAYOUT ARCHITECTURE FOR CORE I/O BUFFER

BACKGROUND OF THE INVENTION

The present invention relates to integrated circuits. In particular, the present invention relates to input/output buffer architecture for integrated circuits.

Integrated circuits are typically formed by depositing and diffusing material into a silicon substrate to form an integrated circuit die. Connections are made to circuit elements within the integrated circuit through bond pads located on the surface of the die. In the past, these bond pads have commonly been located around the perimeter of the die to facilitate connecting the bond pads to a package through a wire bonding process that connects one end of a fine gold or aluminum wire to the bond pad and a second end to the package.

Within an integrated circuit, each bond pad is connected to an input buffer or an output buffer. Input buffers typically include receivers that change the logic levels to be compatible with the requirements of the circuits which comprise the majority of the integrated circuit. Output buffers include drivers that amplify the drive capability in order to efficiently pass output signals from the integrated circuit to a remote location. Typically, the input/output buffers use larger circuit elements than those found on the remainder of the integrated circuit die.

Each buffer, both input and output, also includes an electrostatic discharge region connected directly to the bond pad to protect the integrated circuit from an electrostatic discharge at the bond pad. If a large electrical charge reaches the bond pad, the electrostatic discharge region directs the charge through a network of circuit elements designed to minimize heat generation and over-voltage stress.

In recent years, different techniques have been developed for bonding the integrated circuit die to the package. One technique, known as flip-chip bonding, applies solder bumps to the bond pads and then flips the entire die onto the package. Once the chip is flipped, the solder bumps are heated so that they reflow, making connections between the bond pads and the contacts of the package.

Flip-chip technology has been proposed for use in full-area-array technology where bump pads are not only present at the perimeter of the die, but are present across the entire surface of the die. However, such full-area-array technology has not resulted in large performance gains because the buffers attached to the bump pads, in general, remain at the perimeter of the die. The buffers have not moved to the core of the integrated circuit, where the bump pads are located, because the different sized electronics of the buffer make it difficult to integrate the buffer electronics with the core electronics of the integrated circuit. Specifically, the large size of the buffer electronics and the layout sensitivity of the electrostatic discharge circuitry make it difficult to position the buffer within the core electronics.

SUMMARY OF THE INVENTION

An integrated circuit residing within a die includes at least two columns of circuits separated by a routing space. A buffer is formed within the integrated circuit for transferring signals between the integrated circuit and a location remote from the die. At least one portion of the buffer is formed as a buffer circuit column, where the buffer circuit column is aligned with a column of circuits within the integrated circuit but outside of the buffer.

In preferred embodiments, the buffer is located within the core of the integrated circuit and includes an electrostatic discharge circuit area located between a PMOS circuit area and an NMOS circuit area.

In further embodiments, a conducive ring of material surrounds an area containing the electrostatic discharge circuit area, the PMOS circuit area and the NMOS circuit area. The conductive ring is connectable to routing lines in columns aligned with portions of the buffer such that power carried by the routing lines is not interrupted by the buffer.

Under some embodiments of the present invention, buffers are capable of being grouped together in buffer clusters and are capable of being sized for their specific use.

BRIEF DESCRIPTION OF THE DRAWINGS

FIG. 1 is a top view of an integrated die of the prior art.

FIG. 2 is an expanded top view a buffer portion of an integrated circuit die of the prior art.

FIG. 3 is a top view of an integrated circuit die of the present invention.

FIG. 4 is a top view of a single buffer of the present invention.

FIG. 5 is a top view of a buffer cluster of the present invention.

FIG. 6 is a top view of a buffer cluster of the present invention showing a top metal layer overlay.

DETAILED DESCRIPTION OF THE PREFERRED EMBODIMENTS

FIG. 1 is a top view of an integrated circuit die 100 of the prior art. Integrated circuit die 100 comprises columns of circuit elements 102 which span across most of the integrated circuit and a densely packed memory region 104 located on the left-hand side of the integrated circuit. For clarity, the circuit elements of columns of circuits 102 and memory region 104 are not shown in detail in FIG. 1. Around perimeter 106 of integrated circuit 100 reside a series of input/output (I/O) buffers 108. Each I/O buffer 108 is electrically connected to a respective input/output bond pad 110. Each I/O buffer 108 includes electronic circuit elements that are diffused into the diffusion layer of integrated circuit 100. In a metal layer residing above the diffusion layer, two power conductors 112 and 114 cross over each of the buffers. Each power conductor 112 and 114 carries a separate power signal for powering the electronics of I/O buffers 108.

FIG. 2 is an enlarged top view of section 116 of integrated circuit die 100 of FIG. 1. Section 116 includes an example I/O buffer 130 taken from the set of I/O buffers 108 of FIG. 1. I/O buffer 130 is electrically connected to an input/output bond pad 132 and includes electrostatic discharge electronics 134, NMOS driver electronics 136, PMOS driver electronics 138, and predriver electronics 140. The circuit elements of NMOS driver 136 are powered by connections to power conductor 112, which carries the negative power supply, VSS, for the input/output buffers. The circuit elements of PMOS driver 138 are powered by connections to power conductor 114, which carries the positive power supply, VDD, for the buffers. Typically, power conductors 112 and 114 reside within the same metal layer. This metal layer resides above the substrate in which the circuit elements of NMOS driver 136 and PMOS driver 138 have been diffused and/or deposited.

The circuit elements of predriver electronics 140, which are used to bias the circuit elements of PMOS driver 138 and NMOS driver 136, receive power through connections to core power strips 144 and 146. Power strip 146 carries a positive core power supply voltage and power strip 144 carries a negative core power supply voltage. The positive supply voltage on power strip 146 is separate from the positive supply voltage on power conductor 114. Likewise, the negative power supply on power strip 144 is separate from the negative power supply on power conductor 112.

PMOS driver 138 and NMOS driver 136 use separate power supplies from the core power supplies because the large circuit elements in PMOS driver 138 and NMOS driver 136 would introduce switching noise into the core power supply if they were connected to it.

The ends of three circuit columns 150, 152 and 154, representative of the columns of circuits 102 of FIG. 1, are shown terminating shortly before buffer 130 in FIG. 2. Within each column are two routing lines for carrying a positive core power supply voltage and a negative core power supply voltage, respectively. Each of the routing lines runs parallel to the direction of their respective columns. Specifically, columns 150, 152 and 154 have routing lines 156, 158 and 160, respectively, that carry a positive core power supply voltage and routing lines 162, 164 and 166, respectively, that carry a negative core power supply voltage.

To improve the uniformity of the power found on each of the routing lines in the columns of circuits, each routing line connects to one of the perimeter power strips. Specifically, routing lines 162, 164 and 166 connect to negative core power supply strip 144 and routing lines 156, 158 and 160 connect to positive core power supply strip 146.

Core power strips 144 and 146 typically reside in the second metal layer and routing lines 156, 158, 160, 162, 164 and 166 typically reside in the first metal layer. In addition, the circuit elements of predriver 140 make circuit and power connections in this first metal layer. In order to avoid the metal connections of predriver 140, routing lines 156, 158 and 160 typically have to "jog" around the predriver area or wind through the connections associated with the electronics of the predriver area. This complicates the layout of the integrated circuit and degrades circuit performance due to the added resistance of lines 156, 158 and 160 caused by the additional distance the lines have to traverse.

The circuit elements of NMOS driver 136 and PMOS driver 138 must be separated by a distance 180 to prevent latch-up from occurring. If a distance less than distance 180 separates the two driver regions, inherent parasitic bi-polar junction transistors formed by the PMOS and NMOS circuit elements may cause latchup. Because latch-up can cause the destruction of the integrated circuit, the separation distance 180 is a strict requirement. Thus, in the prior art, separation distance 180 has been maintained even though it creates an open area in the integrated circuit. Such open areas are undesirable since they decrease the spacial efficiency of the integrated circuit.

FIG. 3 shows a top view of an integrated circuit 250 of the present invention. Integrated circuit 250 includes columns of circuits 252, a dense memory region 254 and two core power routing lines 256 and 258.

In integrated circuit 250, input/output buffers have been moved from the perimeter of the integrated circuit to locations within the core of the integrated circuit, interrupting columns of circuits 252. For example, input/output buffer 260 is located within the interior of integrated circuit 250. Similarly, I/O buffer cluster 262, which is comprised of four separate I/O buffers, is located within the interior of integrated circuit 250.

By allowing I/O buffers to be placed in the core of integrated circuit 250, the present invention's input/output buffers improve performance by shortening the distance between the input/output buffer and the circuits that use the input/output buffer to communicate to locations remote from integrated circuit 250. In addition, the core I/O buffers provide simpler power connections to the circuits they serve, which simplifies Computer Aided Design tool development by reducing the complexity of the rules limiting circuit layouts. Moreover, the core I/O buffers enable the efficient use of full-area array technology by allowing efficient package connections at the interior of the die. The enablement of full-area array technology allows for more package connections to the die, which can be utilized to reduce the complexity of the circuits or improve the performance of the circuits.

One aspect of the present invention is that the buffers of integrated circuit 250 are not all the same size. For instance, buffer 261 is smaller than buffer 260. This provides an advantage over the prior art where all buffers are as large as the largest buffer. Thus, the present invention makes more efficient use of die space.

Those skilled in the art will recognize that in FIG. 3 only a sampling of buffers are shown within the core of integrated circuit 250. More buffers are preferably present in the integrated circuit, but are removed from FIG. 3 for clarity.

FIG. 4 is an enlarged view of buffer 260 of FIG. 3. Buffer 260 includes a predriver 262, an NMOS driver circuit area 264, a PMOS driver circuit area 266, an electrostatic discharge circuit area 268 and two power rings 270 and 272.

Buffer 260 is constructed in several layers. At its base is a substrate that includes diffusion areas, which form portions of the circuit elements of predriver 262, NMOS driver circuit area 264, PMOS driver circuit area 266, and electrostatic discharge circuit area 268. The substrate is separated from a first metal layer by an insulating layer. The first metal layer typically contains portion of power rings 270 and 272 as well as connections between the circuit elements of the four circuit areas. A second metal layer is deposited on top of an insulating layer that is deposited on the first metal layer. The second metal layer includes the remaining portions of power rings 270 and 272, which are connected to the portions in the first metal layer by vias passing through the insulating layers at the corners of the power rings. Additional alternating insulator and metal layers are deposited on top of the second metal layer to provide additional conductive pathways discussed below.

Buffer 260 is positioned within the core of integrated circuit 250 and separates first column portions 274, 276, 278 and 280 from second column portions 284, 286, 288 and 290, respectively. Column portions 274 and 284, which are aligned within the same column, are also aligned with predriver 262 of buffer 260. First column portions 276, 278 and 280 are separated from second column portions 286, 288 and 290 by the remainder of buffer 260, which lies within an area defined by power ring 270. Each column portion is horizontally separated from other column portions by a routing space in which routing lines are deposited to connect the circuit elements of the various columns. For clarity, the routing lines are not shown in FIG. 4.

Column portions 274 and 284 include routing lines for carrying power. In column portion 274, routing line 292 carries a positive core power supply voltage and routing line 294 carries a negative core power supply voltage. In column portion 284, routing line 296 carries a positive core power supply voltage and routing line 298 carries a negative core power supply voltage. All four power routing lines are preferably constructed in the first metal layer. One aspect of the present invention is that predriver 262 is aligned with column portions 274 and 284 such that power routing line pairs 300, 302 and 304, 306 of predriver 262 are aligned with routing lines 292, 294 of column portion 274 and routing lines 296, 298 of column portion 284, respectively. Thus, power can be supplied to predriver 262 by making straight line connections between the power routing lines within predriver 262 and the power routing lines within column portions 274 and 284. This simplifies the design of the integrated circuit and maintains maximum performance.

Column portions 276, 278 and 280 include power routing line pairs 308, 310; 312, 314; and 316, 318, respectively. Routing lines 310, 314 and 318 are connected directly to power ring 270, and routing lines 308, 312 and 316 are connected to power ring 272. Column portions 286, 288 and 290 similarly contain routing line pairs 320, 322; 324, 326; and 328, 330, respectively. Routing lines 322, 326 and 330 are connected to power ring 270 and thus are at the same voltage as routing lines 310, 314 and 318 of column portions 276, 278 and 280, respectively. Routing lines 320, 324 and 328 are connected to power ring 272 and are thus at the same voltage as routing lines 308, 312 and 316 of column portions 276, 278 and 280, respectively.

Preferably the portions of power rings 270 and 272 that are in the direction of the routing lines, as well as the routing lines themselves, are all constructed within the first metal layer. The portions of power rings 270 and 272 that are transverse to the routing lines preferably reside in the second metal layer. The connections between the transverse portions of power rings 270 and 272 and the routing lines are made through vias that extend between the first metal layer and the second metal layer. The different portions of the power rings are also connected together through vias from the first metal layer to the second metal layer.

Through their connections to the routing lines of the various column portions, power rings 270 and 272 provide for the uniform distribution of power along the columns of circuits without interfering with the circuit connections of the circuits in PMOS driver area 266, NMOS driver area 264 and electrostatic discharge area 268.

Within the area defined by power ring 272, PMOS driver area 266 is separated from NMOS driver area 264 by a distance 323 sufficient to prevent latch-up. Unlike prior art buffers, the present invention uses the space between the driver areas as the location for the electrostatic discharge area. Thus, the present invention prevents latch-up between PMOS driver 266 and NMOS driver 264 without wasting as much space as prior art I/O buffers.

FIG. 5 is an enlarged view of buffer cluster 262 of FIG. 3. Buffer cluster 262 includes input/output buffers 350, 352, 354 and 356. With reference to the top, bottom, left, and right of the page of FIG. 5, buffer 352 has a predriver 358 located to the left of a power ring 360 that encompasses a second power ring 362. Within the area defined by power ring 362, three circuit regions are vertically aligned and from top to bottom appear as PMOS driver circuit area 364, electrostatic discharge area 366, and NMOS driver circuit area 368.

Each of the other input/output buffers 350, 354 and 356 are identical to input/output buffer 352 except that they have been flipped about the x-axis and/or the y-axis. For example, buffer 350 is a copy of buffer 352 flipped about the y-axis forming a pre-driver 370 to the right of two concentric power rings 372 and 374 that define an area containing a PMOS circuit area 376, an electrostatic discharge circuit area 378 and an NMOS driver circuit area 380.

Buffer 356 is a copy of buffer 352 flipped about the x-axis forming a pre-driver 382 to the left of concentric power rings 384 and 386. Within the area defined by power ring 386, an NMOS driver circuit area 388, an electrostatic discharge area 390, and a PMOS driver circuit area 392 are aligned from the top of the page to the bottom of the page.

Buffer 354 is a copy of buffer 356 further flipped about the y-axis forming a pre-driver 394 to the right of concentric power rings 396 and 398. Within the area defined by power ring 398, an NMOS driver circuit area 400, an electrostatic discharge area 402, and a PMOS driver circuit area 404 are aligned from the top of the page to the bottom of the page.

Power rings 360 and 362 of buffer 352 are connected to power rings 384 and 386, respectively. Specifically, power rings 384 and 360 are connected by three links 406, 408 and 410, and power rings 386 and 362 are connected by three links 412, 414 and 416. Similarly, power rings 396 and 372 are connected together through links 418, 420 and 422, and power rings 398 and 374 are connected together through links 424, 426 and 428.

In preferred embodiments, the portions of power rings 384, 386, 360, 362, 372, 374, 396, and 398 that extend in a direction parallel to the direction of links 406, 408, 410, 412, 414, 416, 418, 420, 422, 424, 426, and 428 are constructed in the first metal layer. Portions of power rings 384, 386, 360, and 362 that are transverse to the direction of the links are preferably constructed in the second metal layer. Connections between the links and their respective transverse portions of the power rings, as well as connections between the respective transverse portions of the power rings and the respective parallel portions of the power rings are made through vias between the first metal layer and the second metal layer.

The interconnection between the power rings of buffers 352 and 356 and the interconnections between the power rings of buffer 350 and 354 allow power to be distributed continuously along the columns of circuits that are interrupted by buffer cluster 262 in a manner similar to that described for buffer 260 above.

Predriver 394 of buffer 354 is aligned with predriver 370 of buffer 350 such that a first routing line 430 and a second routing line 432 of predriver 394 are aligned with a first routing line 434 and a second routing line 436, respectively, of predriver 370. Similarly, predriver 358 of buffer 352 is aligned with predriver 382 of buffer 356 such that a first routing line 438 and a second routing line 440 of predriver 358 are aligned with a first routing line 442 and a second routing line 444, respectively, of predriver 382. The interconnection of the routing lines between predriver 358 and 382 and the interconnection between the routing lines of predriver 370 and 394 permit the distribution of power to be continuous between the portions of the columns interrupted by the predrivers.

Note that predrivers 358 and 382 are aligned with one column of circuits external to the buffer cluster and that predrivers 370 and 394 are aligned with a second column of circuits external to the buffer cluster. This alignment makes it easier to design and build the integrated circuit with such buffers.

FIG. 6 is a top view of buffer cluster 262 of FIG. 5 with a top metalization layer masked over the buffer cluster. The top metalization layer includes a positive power supply trace 500 which extends over the PMOS driver circuit areas of buffers 352, 350, 354 and 356. Circuit elements within each of the PMOS driver circuit areas make contact with a portion of positive power supply trace 500 through vias in the other metalization layers. Through these connections, the circuit elements of the PMOS driver circuits receive power. Positive power supply trace 500 makes contact with a bond pad 502, which is exposed at the top of the die to provide a connection to a remote positive power supply.

The top metalization layer also includes a negative power supply trace 504 that is connected to a bond pad 506 for connection to a remote negative power supply. Negative power supply trace 504 extends over each of the NMOS driver circuit areas in buffers 350, 352, 354 and 356. Through connections to negative power supply trace 504, the circuit elements of the NMOS driver circuit areas receive power.

Each buffer of buffer cluster 262 has an associated input/output pad, which is connected to the buffer's respective electrostatic discharge circuit area. Thus, pad 508 is connected to the electrostatic discharge circuit area of buffer 352 by a metalization trace 510 in the top metalization layer. Similarly, trace 512 connects pad 514 to the electrostatic discharge circuit area of buffer 350, trace 516 connects pad 518 to the electrostatic discharge area of buffer 354, and trace 520 connects pad 522 to the electrostatic discharge area of buffer 356. Through input/output pads 508, 514, 518 and 522, the respective buffers can communicate to locations remote from the integrated circuit.

Although the buffers described above for the present invention only include a single column of circuits for the pre-driver, those skilled in the art will recognize that additional columns of circuits may be added to the buffer to accommodate the requirements of the pre-driver. In addition, the PMOS circuit areas and the NMOS circuit areas may be made larger or smaller than shown to accommodate different design requirements for the buffer.

Although the present invention has been described with reference to preferred embodiments, workers skilled in the art will recognize that changes may be made in form and detail without departing from the spirit and scope of the invention.

What is claimed is:

1. An integrated circuit, residing within a die, the integrated circuit comprising:
    at least two columns of circuits separated by a routing space, the columns of circuits comprising circuit elements; and
    a buffer for transferring signals between the integrated circuit and a location remote from the die, the buffer having a width at least as wide as the combined width of the at least two columns of circuit and the routing space, at least a portion of the buffer formed as a buffer circuit column, the buffer circuit column having a same width as and aligned with a single column of circuits outside of the buffer.

2. The integrated circuit of claim 1 further comprising a routing line for power, the routing line aligned with a column of circuits and the buffer circuit column such that the routing line is straight between the column of circuits and the buffer circuit column.

3. The integrated circuit of claim 1 wherein the integrated circuit has a periphery and a core, the periphery surrounding the core, the buffer located within the core.

4. The integrated circuit of claim 1 wherein the buffer further comprises an electrostatic discharge circuit area, a PMOS circuit area and an NMOS circuit area, the electrostatic discharge area being located between the PMOS circuit area and the NMOS circuit area.

5. The integrated circuit of claim 4 wherein the electrostatic discharge circuit area, PMOS circuit area and NMOS circuit area have respective connections in a metal layer of the integrated circuit, the respective connections surrounded by a metal ring carrying a power signal.

6. The integrated circuit of claim 5 wherein the metal ring is connected to a first routing line for carrying a power signal, the first routing line being associated with a first portion of a first column of circuits.

7. The integrated circuit of claim 6 wherein the metal ring is connected to a second routing line for carrying the power signal, the second routing line being associated with a second portion of the first column, the first portion and the second portion of the first column aligned with each other.

8. The integrated circuit of claim 1 further comprising a second buffer having a second buffer circuit column, the second buffer circuit column aligned with a column of circuits outside of the second buffer.

9. The integrated circuit of claim 8 wherein the buffer is assigned a first buffer space and the second buffer is assigned a second buffer space, the area of the first buffer space larger than the area of the second buffer space.

10. The integrated circuit of claim 1 wherein the buffer is part of a buffer block, the buffer block further comprising a second buffer, a third buffer, and a fourth buffer, the buffer circuit column aligned with a second buffer circuit column in the second buffer, and a third buffer circuit column in the third buffer aligned with a fourth buffer circuit column in the fourth buffer.

11. The integrated circuit of claim 10 wherein within the buffer block the buffer, the second buffer, the third buffer and the fourth buffer are contiguous with each other.

12. A method for producing an integrated circuit layout, the method comprising:
    laying out columns of circuits;
    laying out a buffer for transferring signals between the integrated circuit and a remote location, at least two columns of circuit having ends at the edge of the buffer, the buffer including a buffer column of circuits having a width that matches the width of one of the two columns of circuits; and
    aligning the buffer column of circuits to at least one column of circuits outside of the buffer.

13. The method of claim 12 wherein laying out the buffer comprises:
    laying out a PMOS driver;
    laying out an NMOS driver;
    laying out an electrostatic discharge circuit between the PMOS driver and the NMOS driver.

14. The method of claim 13 wherein the integrated circuit is formed by producing multiple layers positioned vertically over each other and wherein laying out the buffer further comprises laying out a metal ring around an area in one layer where the area is vertically aligned with an area containing the PMOS driver, the NMOS driver, and the electrostatic discharge circuit.

15. The method of claim 14 wherein the metal ring is connected to a first routing line for carrying a first power signal and a second routing line for carrying a second power signal, the first routing line parallel to and aligned with a first portion of a first column of circuits and the second routing line parallel to and aligned with a second portion of the first column of circuits.

16. The method of claim 12 wherein laying out the columns of circuits comprises laying out routing lines for carrying power signals, some of the routing lines forming parallel routing lines that run parallel to the columns of circuits, each of the parallel routing lines located in the same relative position within each column of circuits.

17. The method of claim 16 wherein laying out the buffer comprises laying out routing lines for carrying power signals, some of the routing lines forming parallel routing lines that run parallel to the buffer column of circuits and wherein aligning the buffer comprises aligning the parallel routing lines of the buffer with the parallel routing lines of a columns of circuits.

18. A circuit for performing electronic functions, the circuit comprising:

circuit elements residing in columns and connected together by routing lines; and buffer means for communicating signals between the circuit and a location remote to the circuit, the buffer means located within a core of the circuit such that at least two columns of circuit elements end at the buffer means, the core being surrounded by a periphery of the circuit.

19. The circuit of claim 18 wherein the buffer means comprises at least one buffer column of circuits aligned with at least one column of circuit elements external to the buffer means.

20. The circuit of claim 19 wherein the circuit elements comprise at least one routing line carrying a power signal and extending parallel to the column of circuit elements and wherein the buffer column of circuits comprises at least one routing line carrying the power signal and aligned with the routing line of the circuit elements.

21. The circuit of claim 18 wherein the buffer means comprises:

PMOS driver means for performing communication functions;

NMOS driver means for performing communication functions; and electrostatic discharge means for protecting the PMOS driver means and NMOS driver means from electrostatic discharge, the electrostatic discharge means positioned between the PMOS driver means and the NMOS driver means.

22. The circuit of claim 21 wherein the buffer means further comprises a metal routing line formed in a ring around an area corresponding to the position of the PMOS driver means, the NMOS driver means, and the electrostatic discharge means.

23. The circuit of claim 22 wherein the metal routing line formed in a ring is capable of carrying a power signal from a first power routing line in a first portion of a first column of circuit elements to a routing line in a second portion of the first column of circuit elements.

24. The circuit of claim 21 wherein the communication functions comprise driving an output signal from the buffer means to an external location.

25. The circuit of claim 21 wherein the communication functions comprise receiving an input signal from an external location.

* * * * *